US005495347A

United States Patent [19]

Kim

[11] Patent Number: 5,495,347
[45] Date of Patent: Feb. 27, 1996

[54] COLOR CONTACT IMAGE SENSOR

[75] Inventor: Jung J. Kim, Seoul, Rep. of Korea

[73] Assignee: Gold Star Co., Ltd., Seoul, Rep. of Korea

[21] Appl. No.: 332,609

[22] Filed: Oct. 31, 1994

Related U.S. Application Data

[63] Continuation of Ser. No. 971,430, Nov. 4, 1992, abandoned.

[30] Foreign Application Priority Data

Nov. 6, 1991 [KR] Rep. of Korea ................. 91-19654

[51] Int. Cl.$^6$ .............................. H04N 1/04; H04N 1/46
[52] U.S. Cl. ................ 358/483; 358/482; 358/513; 358/514; 348/272; 348/275; 348/294
[58] Field of Search ...................... 358/482, 483, 358/513, 514; 250/208.1; 348/266, 272, 275, 277, 281, 294, 302, 304, 307, 308

[56] References Cited

U.S. PATENT DOCUMENTS

| | | | |
|---|---|---|---|
| 4,663,535 | 5/1987 | Nakai et al. | 358/513 |
| 4,709,259 | 11/1987 | Suzuki | 358/44 |
| 4,819,082 | 4/1989 | Ito et al. | 358/482 |
| 4,870,483 | 9/1989 | Nishigaki et al. | 358/483 |
| 4,887,166 | 12/1989 | Kakinuma et al. | 358/213.11 |
| 4,930,006 | 5/1990 | Murayama et al. | 358/43 |
| 4,972,255 | 11/1990 | Suzuki et al. | 358/482 |
| 4,989,075 | 1/1991 | Ito | 358/43 |
| 5,027,226 | 6/1991 | Nagata et al. | 358/213.11 |
| 5,031,032 | 7/1991 | Perregaux et al. | 358/513 |
| 5,119,183 | 6/1992 | Weisfield et al. | 358/482 |
| 5,132,803 | 7/1992 | Suga et al. | 358/43 |
| 5,142,381 | 8/1992 | Kitamura et al. | 358/483 |
| 5,150,204 | 9/1992 | Yamazaki | 358/43 |

FOREIGN PATENT DOCUMENTS 145199  6/1985  European Pat. Off. .

OTHER PUBLICATIONS

European Search Report: EP 92 40 2966, Jul. 23, 1993.

*Primary Examiner*—Edward L. Coles, Sr.
*Assistant Examiner*—Kimberly A. Williams
*Attorney, Agent, or Firm*—Pennie & Edmonds

[57] ABSTRACT

A color contact image sensor is a device for sensing a character, a diagram, and a drawing on a colored document and transmitting a sensed signal. The color contact image sensor comprises a dot cell array composed of dot cells having sensing elements for sensing red, green and blue color components, so as to sense color information printed on a point of a document. Red, green and blue color component sensing signals generated by the dot cells are sequentially supplied to a signal outputting portion under the control of a driving portion, and the signal outputting portion converts the red, green and blue color component sensing signals into digital data.

6 Claims, 5 Drawing Sheets

COLOR CONTACT IMAGE SENSOR

This is a continuation of application Ser. No. 07/971,430, filed Nov. 4, 1992, now abandoned.

BACKGROUND OF THE INVENTION

The present invention relates to a contact image sensor for sensing characters, diagrams and drawings on a document, and more particularly to a color contact image sensor which can sense and transmit characters, diagrams, and drawings of a colored document.

Generally, a contact image sensor (hereinafter referred to as "CIS") is utilized in a facsimile to sense the shapes and gray levels of characters, diagrams, and drawings on a document to be transmitted or in a hand scanner, a peripheral equipment of a personal computer, to sense the shapes and gray levels of the images on a document to be processed by the personal computer. However, the conventional CIS has a problem in that it can sense a black/white document, but not a colored document. This problem is described with reference to the attached drawings as follows.

With reference to FIG. 1, a CIS comprising m sensing portions B1 to Bm connected commonly to n data lines DL1 to DLn and respectively to m address lines AD1 to ADm is described. The m sensing portions B1 to Bm are composed of n dot cells DS11 to DSmn, each of which is composed of one of photodiodes PD11 to PDmn and one thin film transistor (hereinafter referred to as "TFT"). The anodes of the photodiodes PD11 to PDmn are commonly connected to a reverse bias voltage source 14 and the source terminals of the TFTs Q11 to Qmn are respectively connected to the cathodes of the photodiodes PD11 to PDmn. The drain terminals of the TFTs Q11 to Q1n within a first sensing portion B1 are respectively connected to n data lines DL1 to DLn, and the gate terminals of the TFTs Q11 to Q1n within the first sensing portion B1 are commonly connected to a first address line AD1. Also, the drain terminals of the TFTs Qm1 to Qmn within the m'th sensing portion Bm are respectively connected to n data lines DL1 to DLn, and the gates of the TFTs Qm1 to Qmn within the m'th sensing portion Bm are commonly connected to the m'th address line ADm.

The CIS additionally comprises a driving portion 10 connected to the first-to-m'th address lines AD1 to ADm, and a signal outputting portion 12 connected to the first-to-n'th data lines DL1 to DLn. The driving portion 10 sequentially drives the first-to m'th sensing portions B1 to Bm through the first-to-m'th address lines AD1 to ADm, thereby sequentially supplying the outputs of the first-to-m'th sensing portions B1 to Bm to the signal outputting portion 12. And, the signal outputting portion 12 transmits the sequentially received outputs of the first-to-m'th sensing portions B1 to Bm to a signal processing portion (not shown).

Meanwhile, the photodiodes PD11 to PDmn within the first-to-m'th sensing portions B1 to Bm generate a current corresponding to the optical density from an incident light source (not shown) reflected by a document, and store the generated current in the internal capacitor (not shown). And, the TFTs Q11 to Qmn transmit the current stored in the photodiodes PD11 to PDmn to the signal outputting portion 12, when a driving signal is supplied from the driving portion 10 to their gates. In detail, the n TFTs Q11 to Q1n of the first sensing portion B1 transmit the current stored in the photodiodes PD11 to PD1n to the signal outputting portion 12, when a driving signal is supplied from the driving portion 10 through the first address line AD1. And, the n TFTs Qm1 to Qmn of the m'th sensing portion Bm transmit the current stored in the photodiodes PDm1 to PDmn to the signal outputting portion 12, when a driving signal is supplied from the driving portion 10 through the m'th address line ADm. Then, the signal outputting portion 12 converts the current generated by the photodiodes PD11 to PDmn into digital data. The digital data has different logic values according to the amount of current generated by the photodiodes PD11 to PDmn. The amount of current generated in the photodiodes PD11 to PDmn varies according to the gray levels of the characters, diagrams, and drawings in a document.

FIG. 2 shows a layout of the first-to-third dot cells DS11 to DS13 of the first sensing portion B1 which is a part of CIS. With reference to FIGS. 1 and 2, the first-to-third photodiodes PD11 to PD13, whose anodes are connected to the reverse bias voltage line 14, are horizontally arranged in parallel. The first-to-third TFTs Q11 to Q13, whose source electrodes are connected to the cathodes of the diodes PD11 to PD13, respectively, are arranged in parallel with the first-to-third photodiodes PD11 to PD13. For the first-to third photodiodes PD11 to PD13 to maintain a relatively large light receiving area for one point of a document, their vertical axis length is longer than their horizontal axis length. And, the gates of the first-to-third TFTs Q11 to Q13 are commonly connected to the first address line AD1 and the drain electrodes of the first-to third TFTs Q11 to Q13 are respectively connected to the first-to third data lines DL1 to DL3.

FIG. 3 is a cross sectional view taken on line A–A' of the first-to-third photodiodes PD11 to PD13 shown in FIG. 2. In FIG. 3, a CIS comprising a substrate 20 coated with an insulating film made of SiN is described. A plurality of metallic electrodes 22 made of chromium Cr are deposited on the insulating film 21. Light-receiving material layers 23 and transparent electrodes 24 are laminated on the plurality of metallic electrodes 22. The light receiving material layer 23 is made of amorphous silicon. A protecting film made of polyimide is deposited on the insulating film 21 and the transparent electrode 24.

As described above, since the conventional CIS is formed to be able to sense and process the gray level of characters, diagrams or drawings on a document, it can process documents having black and white information, but not a colored document.

SUMMARY OF THE INVENTION

Accordingly, it is an object of the present invention to provide a color CIS which can sense and process a colored document. It is another object of the present invention to provide a method of manufacturing the color CIS.

To achieve the first object, the color CIS of the present invention comprises:

a sensing cell array composed of unit cells having red, green and blue color sensing elements for sensing red, green and blue color components of color information printed on a point of a document, and three controlling switch elements respectively connected to the sensing elements, for selectively outputting the outputs of the red, green and blue color sensing elements;

an outputting means for processing the red, green and blue color component sensing signal from the unit cells of the sensing cell array, to be digital data; and a driving means for driving the controlling switches according to the color component of the color component sensing elements.

To achieve the second object of the present invention, the color CIS manufacturing method of the present invention comprises the steps of:

providing a substrate;

forming a plurality of photodiodes where a plurality of anode electrodes, light-receiving material layers and transparent electrodes are laminated, and a plurality of thin film transistors for driving the photodiodes, on the substrate;

forming an insulating film on the transparent electrode;

forming passing holes on the insulating film and forming wires for respectively connecting the plurality of transparent electrodes to the source electrodes of the plural thin film transistors through the passing holes;

coating a protecting film on the wires and insulating film; and forming filters by dyeing regions of the protecting film where the transparent electrodes are formed, into red, green and blue colors.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE INVENTION

Figure 4:
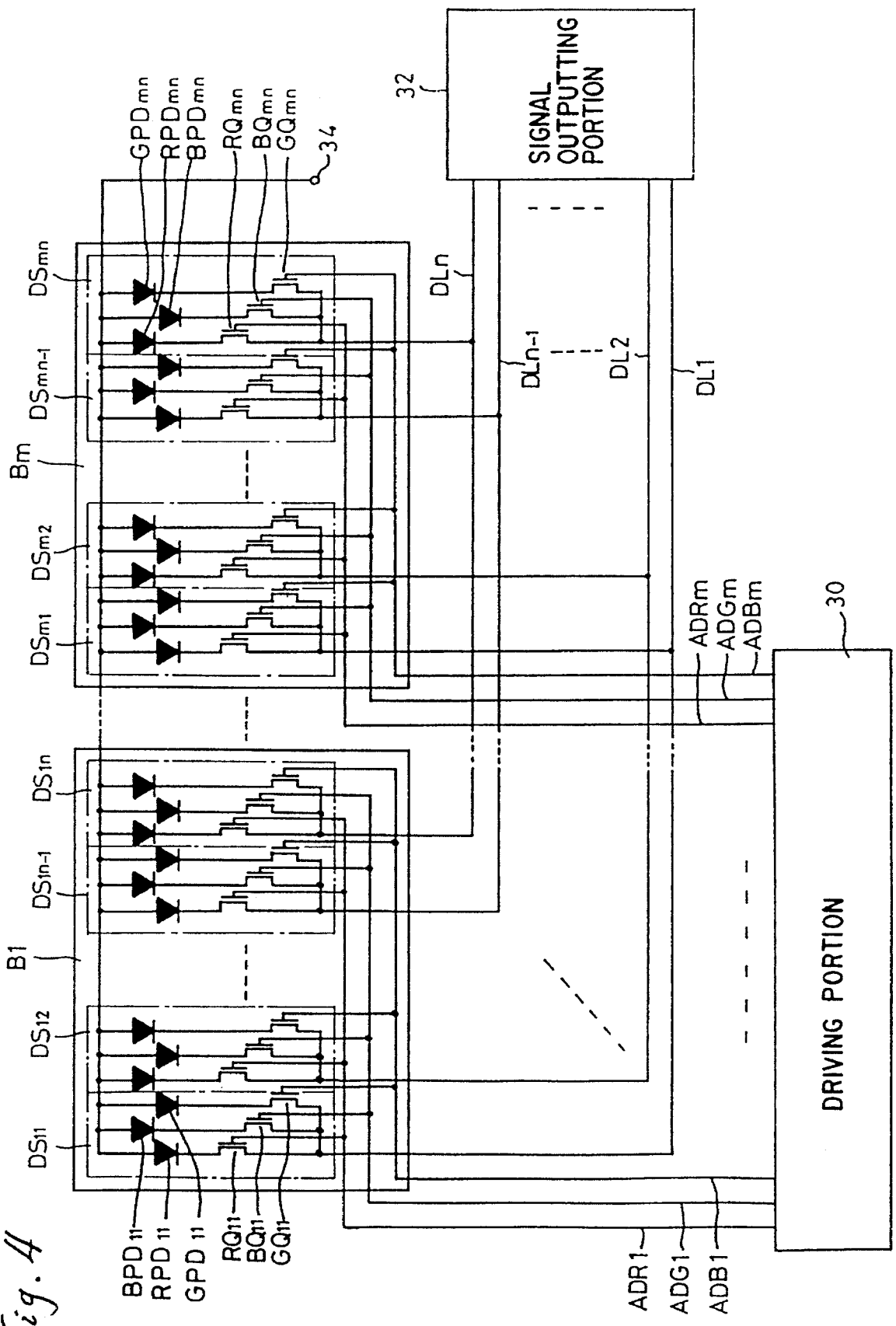
FIG. 4 shows an equivalent circuit of a color CIS according to an embodiment of the present invention.

With reference to FIG. 4, a color CIS according to an embodiment of the present invention, comprising m sensing portions B1 to Bm is described. The m sensing portions B1 to Bm are composed of n dot cells DS11 to DSmn for sensing n color information printed on n points of a document. The dot cells DS11 to DSmn comprise photodiodes RPD11 to RPDmn for red color, photodiodes GPD11 to GPDmn for green color, and photodiodes BPD11 to BPDmn for blue color, each anode of which is connected to a reverse bias voltage line 34, and TFTs RQ11 to RQmn, GQ11 to GQmn, and BQ11 to BQmn for red color, green color, and blue color, the sources of which are connected to the cathodes of red color, green color, and blue color photodiodes RPD11 to RPDmn, GPD11 to GPDmn and BPD11 to BPDmn, respectively. The drain electrodes of red color, green color, and blue color transistors RQ11 to RQmn, GQ11 to GQmn, and BQ11 to BQmn of the respective dot cells DS11 to DSmn are connected to each other in each dot cell. And, the gates of the red color TFTs RQ11 to RQmn, classified by sensing portions B1 to Bm, are commonly connected to the first-to-m'th red color address lines ADR1 to ADRm, respectively. In more detail, the gates of the red color TFTs RQ11 to RQ1n within the first sensing portion B1 are commonly connected to the first red color address line ADR1, and the gate electrodes of the red color TFTs RQm1 to RQmn within the m'th sensing portion Bm are commonly connected to the m'th red color address line ADRm. As described above, the red color TFTs RQ21 to RQ(m−1)n within the second-to-m−1'th sensing portions B2 to Bm−1 are commonly connected to the second-to-m−1'th red color address lines ADR2 to ADRm−1 corresponding to each sensing portion. By the same way as the gates of the red color TFTs RQ11 to RQmn, the gates of green color TFTs GQ11 to GQmn and the gates of blue color TFTs BQ11 to BQmn are commonly connected to the green color address lines ADG1 to ADGm and the blue color address lines ADB1 to ADBm, respectively, corresponding to each sensing portion. The drain electrodes of red, green and blue color TFTs RQ11 to RQmn, GQ11 to GQmn, and BQ11 to BQmn within the respective sensing portions B1 to Bm are commonly connected to the data lines DL1 to DLn, corresponding to each dot cell. In detail, the drain electrodes of red color TFTs RQ11, RQ21, RQ31, . . . , RQm1, green color TFTs GQ11, GQ21, GQ31, . . . , GQm1, and blue color TFTs BQ11, BQ21, BQ31, . . . , BQm1 in the first dot cells DS11, DS21, DS31, . . . , DSm1 of the first-to-m'th sensing portions B1 to Bm are commonly connected to the first data line DL1, and the drain electrodes of red color TFTs RQ1n, RQ2n, RQ3n, . . . , RQmn, green color TFTs GQ1n, GQ2n, GQ3n, . . . , GQmn, and blue color TFTs BQ1n, BQ2n, BQ3n, . . . , BQmn in the n'th dot cells DS1n, DS2n, DS3n, . . . , RQmn of the first-to-m'th sensing portions B1 to Bm are commonly connected to the n'th data line DLn. As the same way, the drain electrodes of red color TFTs RQ12 to RQ1(n−1), RQ22 to RQ2(n−1), . . . , RQm2 to RQm(n−1), green color TFTs GQ12 to GQ1(n−1), GQ22 to GQ2(n−1), . . . , GQm2 to GQm(n−1) and blue color TFTs BQ12 to BQ1(n−1), BQ22 to BQ2(n−1), . . . , BQm2 to BQm(n−1) in the second to n−1 dot cells DS12 to DS1(n−1), DS22 to DS2(n−1), . . . , DSm2 to DSm(n−1) of the first-to-m'th sensing portions B1 to Bm are commonly connected to the corresponding data lines DL2 to DL(n−1) according to the respective dot cell.

The color CIS additionally comprises a signal outputting portion 32 connected to the first to n'th data lines DL1 to DLn and a driving portion 30 connected to the address lines ADR1 to ADRm, ADG1 to ADGm and ADB1 to ADBm. The signal outputting portion 32 sequentially receives the red, green and blue color component signals sensed by the first-to-m'th sensing portions B1 to Bm, converts the sequentially received signal into digital data, and transmits it to a signal processing portion (not shown). The driving portion 30 supplies signals of high logic state to the gates of the TFTs RQ11 to RQmn, GQ11 to GQmn, and BQ11 to BQmn through the address lines ADR1 to ADRm, ADG1 to ADGm and ADB1 to ADBm, according to the sensing portion and the component to be sensed, thereby having the red color component signals sensed by the red color photodiodes RQ11 to RQmn, the green color component signals sensed by the green color photodiodes GQ11 to GQmn, and the blue color component signals sensed by the blue color photodiodes BQ11 to BQmn be transmitted sequentially according to the sensing portion to the signal outputting portion 32 through the data lines DL1 to DLn. Meanwhile, the red color photodiodes RPD11 to RPDmn, the green color photodiodes GPD11 to GPDmn and the blue color photodiodes BPD11 to BPDmn generate a current corresponding to the optical density from the incident light source reflected by a document and store the generated current in the internal capacitor (not shown). The red color TFTs RQ11 to RQmn, green color TFTs GQ11 to GQmn, and blue color TFTs BQ11 to BQmn transmit the current signals stored in the red color photodiodes RPD11 to RPDmn, green color photodiodes GPD11 to GPDmn, and blue color photodiodes BPD11 to BPDmn to the signal outputting portion 32, when driving signals of high logic state are supplied to their respective gate electrodes according to each sensing portion. Then, the signal outputting portion 32 converts the sensed red, green, and blue color component signals supplied sequentially according to the color component and the sensing portion from the first-to-m'th sensing portions B1 to Bm into digital data, and supplies the converted red, green and blue color component data to the signal processing portion.

Figure 5:
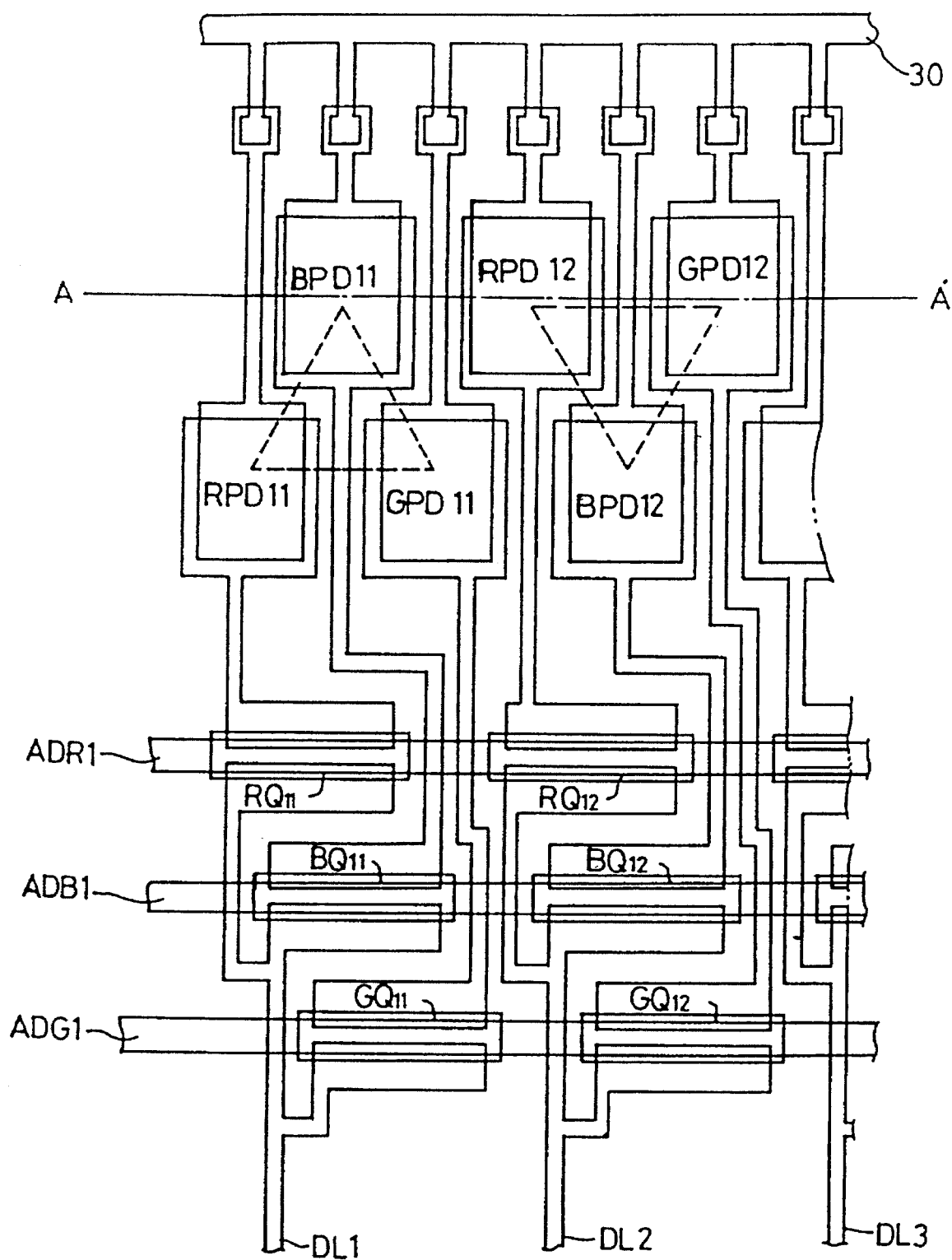
FIG. 5 is a layout showing a part of the first sensing portion shown in FIG. 4.

FIG. 5 illustrates a first sensing portion B1 shown in FIG. 4, which comprises red, green and blue color photodiodes RPD11, RPD12, GPD11, GPD12, BPD11 and BPD12, alternately arranged in two rows. The red color photodiode RPD11, green color photodiode GPD11, and blue color photodiode BPD11 are arranged to form a triangle, thereby forming a color sensing element of the first dot cell DS11 for sensing color information printed on one point of a document. The red color photodiode RPD12, green color photodiode GPD12, and blue color photodiode BPD12 are arranged to form a reverse triangle, thereby forming a color sensing element of the second dot cell DS12. The anodes (upper electrodes) of red, green and blue color photodiodes RPD11, RPD12, GPD11, GPD12, BPD11, and BPD12 of the first and second dot cells DS11 and DS12 are connected to a reverse bias voltage line 34. Among them, the photodiodes RPD11, GPD11, and BPD12 arranged in the lower row are connected to the reverse bias voltage line 34 by wires formed between the photodiodes BPD11, RPD12, and GPD12 of the upper row.

The first sensing portion B1 comprises TFTs RQ11, RQ12, BQ11, BQ12, GQ11, and GQ12 arranged in three rows. The gate electrodes of the first-row red color TFTs RQ11 and RQ12, the gate electrodes of the second-row blue color TFTs BQ11 and BQ12, and the gate electrodes of the third-row green color TFTs GQ11 and GQ12 are connected to a first red color address line ADR1, a first blue color address line ADB1, and a first green color address line ADG1, respectively. The source electrodes of the TFTs RQ11, RQ12, GQ11, GQ12, BQ11, and BQ12 are connected to the cathodes (lower electrodes) of the photodiodes RPD11, RPD12, GPD11, GPD12, BPD11 and BPD12, and among them, the source electrodes of the TFT. BQ11 is connected by wires running between the lower photodiodes RPD11 and GDP11, and the source electrode of the TFT RQ12 is connected by wires running between the lower photodiodes GPD11 and BPD12. The source electrode of the TFT GQ12 is connected by wires running between the lower photodiodes BPD12 and RPD13, RPD13 being of the third dot cell DS13 (partially shown). The TFTs RQ11, GQ11, and BQ11 whose drain electrodes are commonly connected to the first data line DL1 form a first dot cell DS11 together with the photodiodes RPD11, GPD11 and BPD11, and the TFTs RP12, GP12 and BP12 whose drain electrodes are commonly connected to the second data line DL2 form a second dot cell DS12 together with the three photodiodes RPD12, GPD12 and BPD12.

Figure 1:
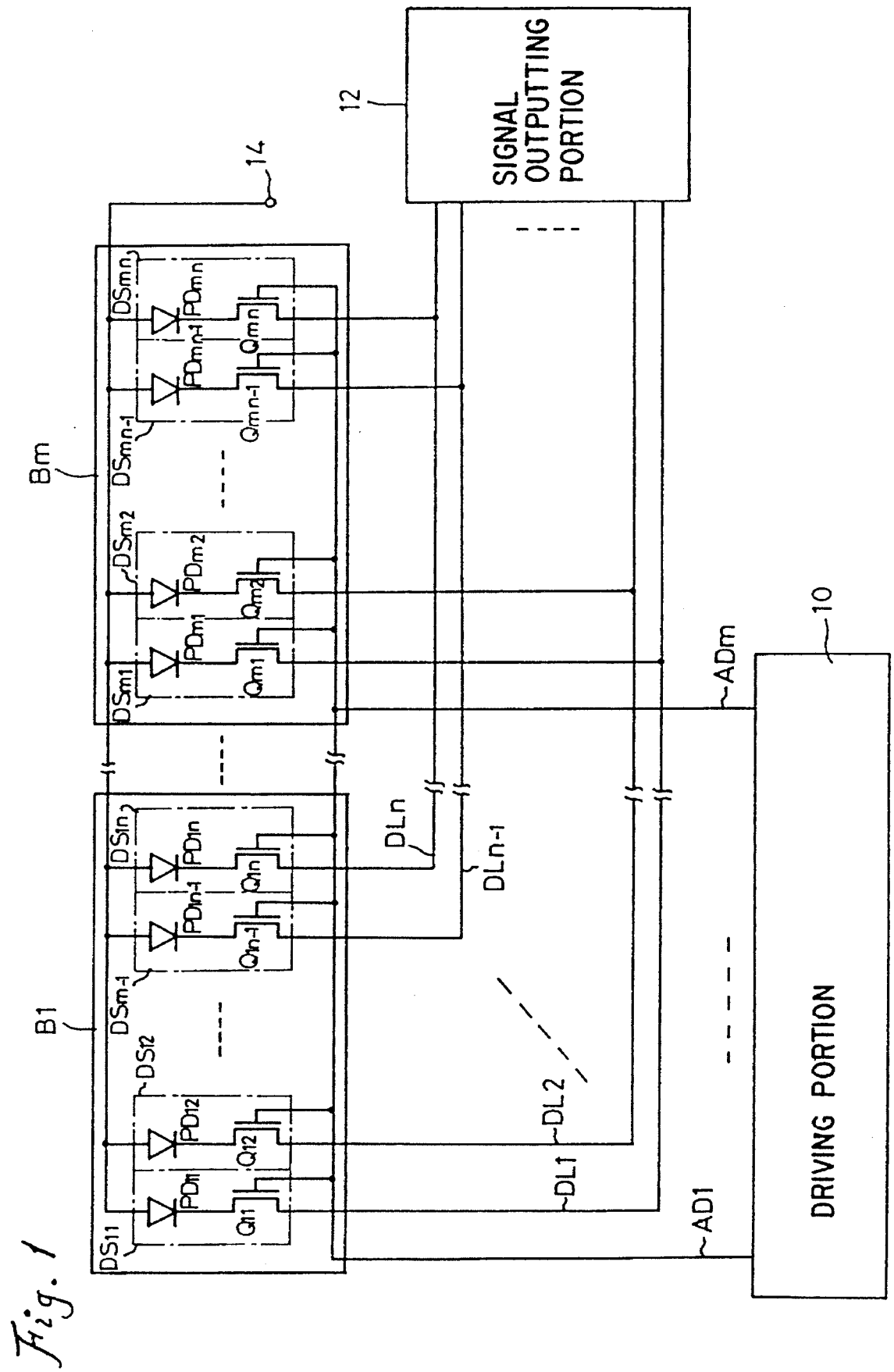
FIG. 1 shows an equivalent circuit of a conventional CIS.
Figure 2:
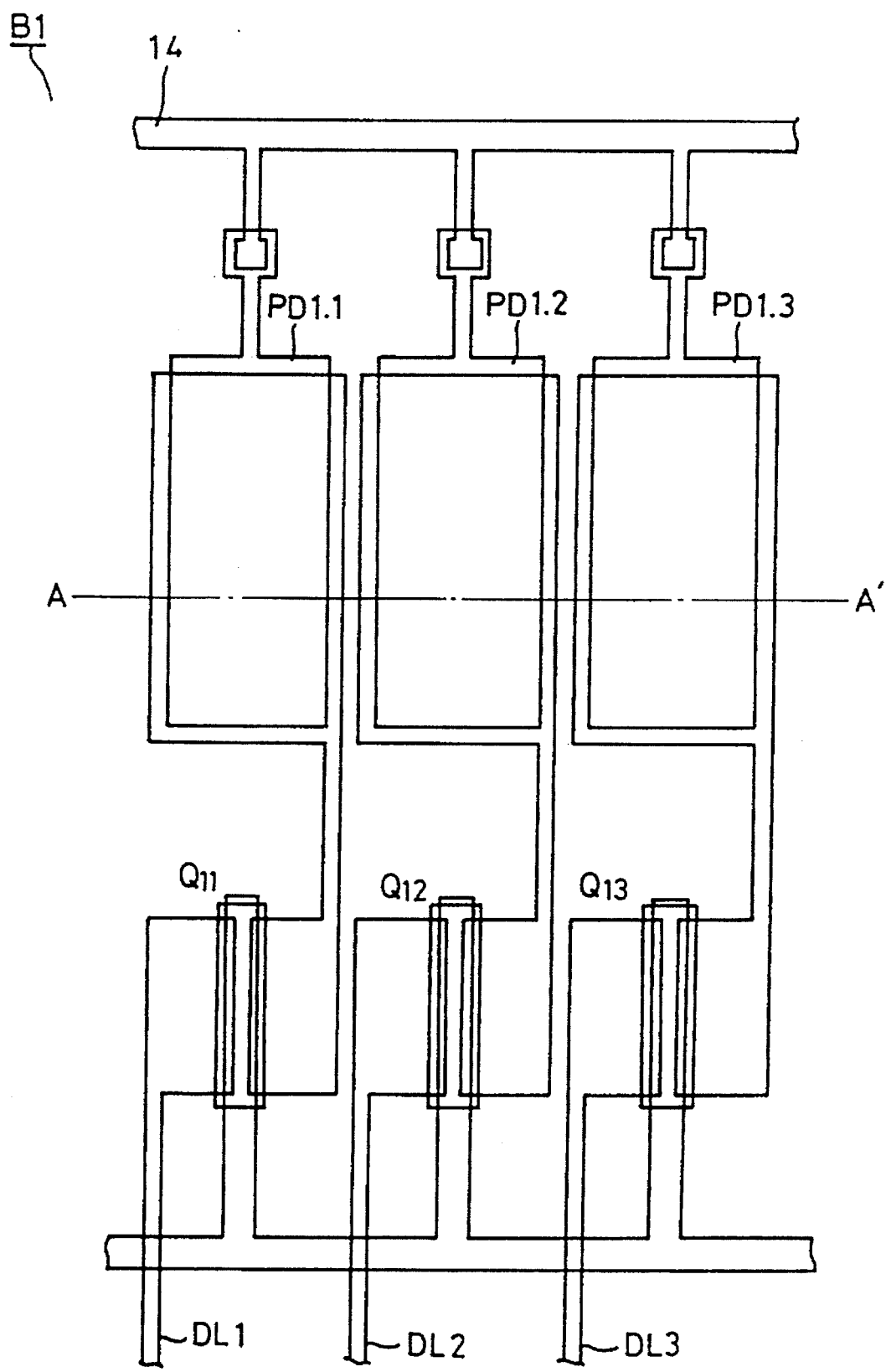
FIG. 2 shows a layout of first-to-third dot cells of the first sensing portion shown in FIG. 1.
Figure 3:
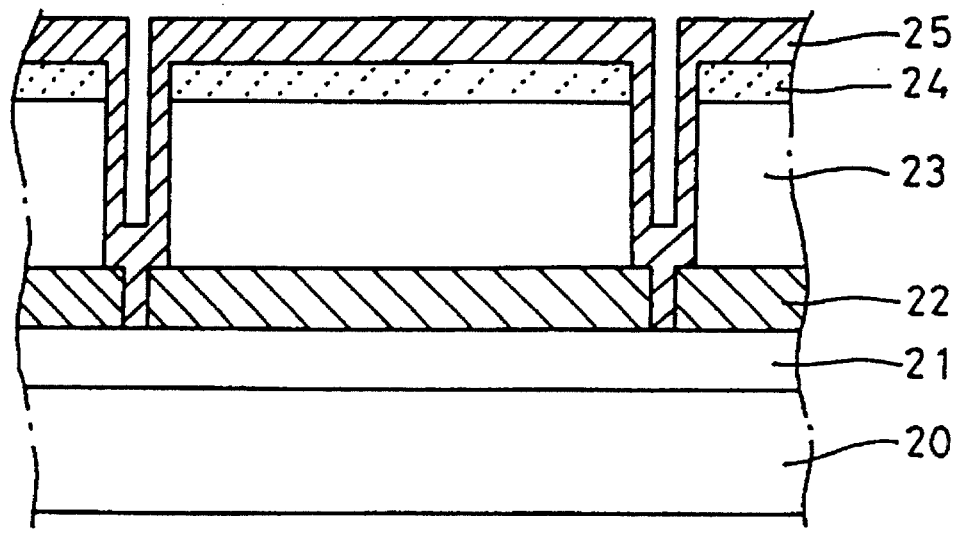
FIG. 3 is a sectional view of the first-to-third photodiodes shown in FIG. 2.
Figure 6:
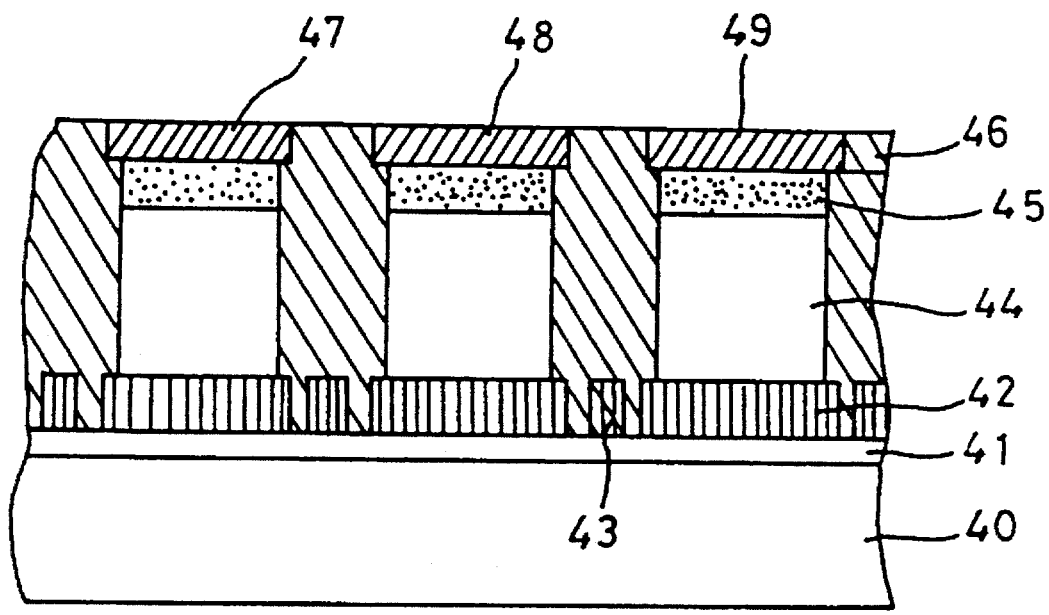
FIG. 6 is a sectional view of the photodiodes shown in FIG. 5.

FIG. 6 illustrates a view taken on line A-A' of the photodiodes BPD11 and RPD12, and GPD12 shown in FIG. 5. FIG. 6 shows a substrate 40 on which an insulating film 41 made of silicon nitride is coated. The substrate 40 is made of glass. A plurality of cathode electrodes 42 and connecting wires 43 arranged in a horizontal axis are formed on the insulating film 41. The cathode electrodes 42 and connecting wires 43 are patterned by depositing a metallic material and photo-etching the deposited metallic material. A light receiving material 44 made of amorphous silicon is laminated on the anode electrode. A transparent electrode 45, an anode electrode made of indium-tin oxide (ITO), is formed on the light-receiving material layer 44. The light-receiving material layers 44 and the transparent electrodes 45 are patterned by photo-etching. An insulating film (not shown) made of silicon nitride is coated on the transparent electrodes 45, and wires (not shown) connecting the transparent electrodes 45 to TFTs (not shown) by passing through the insulating film are formed. A protecting film 46 made of polyimide is coated on the wires and insulating film. The parts of protecting film 46, where the transparent electrodes 45 are disposed, are dyed into red, green and blue colors, thereby forming red, green and blue color filters (47, 48 and 49). The red, green and blue color filters 47, 48, and 49 are disposed to form a triangle.

As described above, since the dot cell of CIS has red, green and blue color photodiodes, the present invention has an advantage of providing a color CIS which can sense color information printed on a point of a document.

What is claimed is:

1. A color contact image sensor comprising:

a linear dot cell array composed of dot cells each having red, green, and blue color sensing elements arranged in two rows, forming a triangle for sensing red, green, and blue color components of color information printed on a point of a document, and thin film transistor switch elements respectively connected to said sensing elements, one for each of said sensing elements, for selectively switching said sensing elements and outputting outputs of said red, green, and blue color sensing elements, each of said switch elements having gate, drain, and source electrode, and wherein said dot cell array is divided into m group of n dot cell;

a plurality of gate lines connected to said gate electrodes of said thin film transistor switch elements that are connected to said sensing element of the same color in said group, respectively;

a plurality of drain lines connected to said drain electrodes of said thin film transistor switch elements, each of said drain lines consisting of three of said red, green, and blue sensing elements and being commonly used in each of said groups;

a driving means for driving said thin film transistor switching elements sequentially, said gate lines being connected to said driving means; and read-out means for reading a signal from said drain electrodes, said drain lines being connected to said read-out means.

2. A color contact image sensor as claimed in claim 1, further comprising a glass substrate on which said sensing elements are formed.

3. A color contact image sensor as claimed in claim 1, wherein said sensing elements are made of photodiodes.

4. A color contact image sensor as claimed in claim 3, wherein said source electrodes of said thin film transistor switch elements are connected to said photodiodes respectively.

5. A color contact image sensor as claimed in claim 4, wherein said two rows of dot cells comprise upper-row photodiodes and lower-row photodiodes, wherein said upper-row photodiodes are connected to said source electrodes of said thin film transistor switch elements by lines formed between said lower-row photodiodes.

6. A method of manufacturing a color contact image sensor comprising the steps of:

providing a glass substrate;

forming an image sensing device comprising a linear dot cell array having a plurality of dot cells arranged linearly, each cell having red, green, and blue color sensing elements arranged in two rows, forming a triangle, each sensing element including a photodiode, and a plurality of thin film transistors for driving said photodiodes, one for each photodiode, on said substrate;

forming a polyamide passivation film on entire surface of said image sensing device; and forming red, green, and blue filters by dyeing regions of said polyamide passivation film where said transparent electrodes are disposed, into red, green, and blue colors.

* * * * *